United States Patent [19]
Chen et al.

[11] Patent Number: 6,064,076
[45] Date of Patent: May 16, 2000

[54] LIGHT-EMITTING DIODE HAVING A TRANSPARENT SUBSTRATE

[75] Inventors: Lung-Chien Chen, Tao-Yuan Hsien; Kun-Chuan Lin, Taipei, both of Taiwan

[73] Assignee: Visual Photonics Epitaxy Co., Ltd., Taoyuan, Taiwan

[21] Appl. No.: 09/082,036

[22] Filed: May 20, 1998

[51] Int. Cl.[7] .................................................. H01L 33/00
[52] U.S. Cl. .............................. 257/22; 257/96; 257/101; 257/103
[58] Field of Search .................................... 257/14, 15, 22, 257/94, 96, 101, 103, 190, 97; 372/43, 45, 46

[56] References Cited

U.S. PATENT DOCUMENTS

| | | | |
|---|---|---|---|
| 4,570,172 | 2/1986 | Henry et al. | 257/94 |
| 5,237,581 | 8/1993 | Asada et al. | 372/45 |
| 5,523,589 | 6/1996 | Edmond et al. | 257/103 |

*Primary Examiner*—Minh Loan Tran

[57] ABSTRACT

A light-emitting diode having a transparent substrate contains a transparent GaP substrate having a first lattice constant, a first ohmic contact to the GaP substrate, a buffer layer having a graded lattice constant which gradually changes from a first lattice constant to a second lattice constant, a light generating region formed on the buffer layer and having the second lattice constant, and a second ohmic contact formed on the light generating region. In the present invention, light emitted to the substrate is not absorbed by the transparent substrate. Therefore, the brightness of the LED is increased and the $V_f$ value is not increased.

3 Claims, 5 Drawing Sheets

6,064,076

LIGHT-EMITTING DIODE HAVING A TRANSPARENT SUBSTRATE

FIELD OF THE INVENTION

This invention relates to a light-emitting diode (LED), and particularly to a light-emitting diode having a transparent substrate on which a buffer layer is formed. The buffer layer has a graded composition and the lattice constant of it is changed from the lattice constant of the substrate to the lattice constant of the light generating region. Therefore, the brightness of the LED is increased but not the foreward voltage ($V_f$) value does not increase.

BACKGROUND OF THE INVENTION

U.S. Pat. Nos. 5,008,718 and 5,233,204 disclose conventional LEDs having a transparent window layer. With these structures the well-known crowding effect is improved and the light from the surface of the LEDs is increased. Therefor, the brightness of the conventional LEDs is significantly increased. However, The conventional LEDs do not give the highest desired light brightness because the brightness is affected by many factors, such as crowding effect, incident light critical angle, substrate light absorption, etc.

U.S. Pat. Nos. 5,237,581 and 4,570,172 disclose DBR LEDs having a semiconductor multilayer reflector i.e., Distributed Bragg Reflector. The DBR of LEDs reflect the light incident into the substrate back to emit from the DBR LED. The light brightness of the DBR LEDs is increased. However, the addition of multilayer reflector forms many hetero junctions and thus the driving voltage or the power consumption of the DBR LEDs is increased.

SUMMARY OF THE INVENTION

It is an object of the present invention to provide a light-emitting diode having a transparent substrate. According to the present invention, the transparent substrate is GaP semiconductor material. The lattice constant of the buffer layer which is formed on the GaP transparent substrate, has a first lattice constant at the junction between the transparent substrate and the buffer layer and is gradually changed to a second lattice constant at the junction between the buffer layer and the light generating region. The $V_f$ value of the LED of the present invention is not increased and the light extraction efficiency of the LED is improved. The GaP transparent substrate is cheap and thus the production cost of the LED is decreased.

It is another object of the present invention to provide a light-emitting diode having a transparent substrate. The buffer layer having a graded lattice constant may be applied not only to the double hetero LEDs (DH LED), but also to the single hetero LEDs (SH LED) and to the homo junction LED.

BRIEF DESCRIPTIONS OF THE INVENTION

DETAILED DESCRIPTIONS OF THE INVENTION

Figure 1:
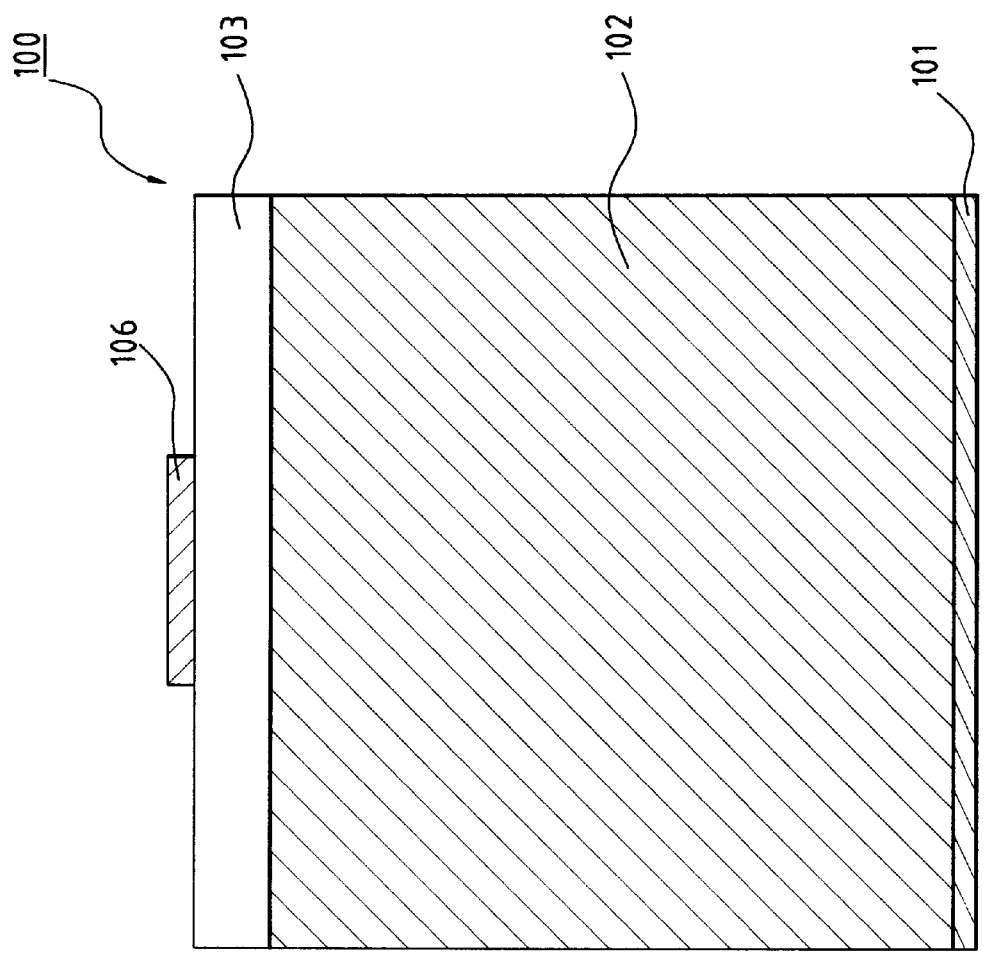
FIG. 1 is a cross-sectional view of the well-known LED.
Figure 2:
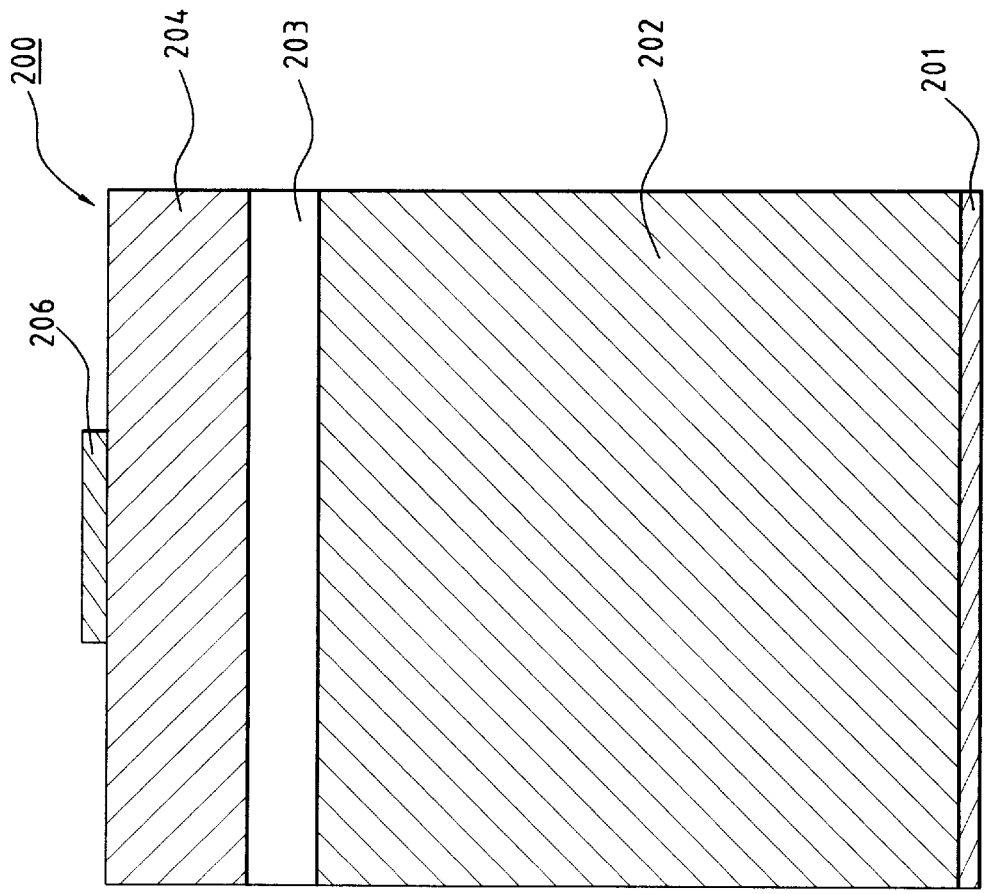
FIG. 2 is a cross-sectional view of the conventional LED having a transparent window layer.

FIG. 1 shows a cross-sectional view of a well-known LED. The well-known LED contains a semiconductor substrate 102, a second ohmic contact 101 formed under the substrate 102, a light generating region 103 formed on the substrate 102, and a first ohmic contact 106. The brightness of the well-known LED is not high because of many factors, such as crowding effect, incident light critical angle, and light absorption of the substrate, etc. Therefore, U.S. Pat. Nos. 5,008,718 and 5,233,204 disclose conventional LEDs having a transparent window layer to increase the light emitted from the conventional LEDs as shown in FIG. 2. The conventional LED 200 is made by forming a transparent window layer 204 on the well-known LED 100 of FIG. 1. The suitable materials for forming the transparent window layer 204 contain GaP, GaAsP and AlGaAs which have a bandgap greater than that of AlGaInP material of the light generating region. Although, by means of the transparent window layer, the brightness and the forward bias voltage $V_f$ of the LED is increased and a bandgap discontinuity problem ($\Delta E_c$ and $\Delta E_v$) arises because a hetero junction is formed between transparent window layer 204 and an upper layer of the AlGaInP light generating region. Thus, the power consumption of the conventional LEDs is increased. The forward bias voltage $V_f$ is defined as the voltage value measured when a forward current 20 mA is applied to the conventional LEDs.

Figure 3:
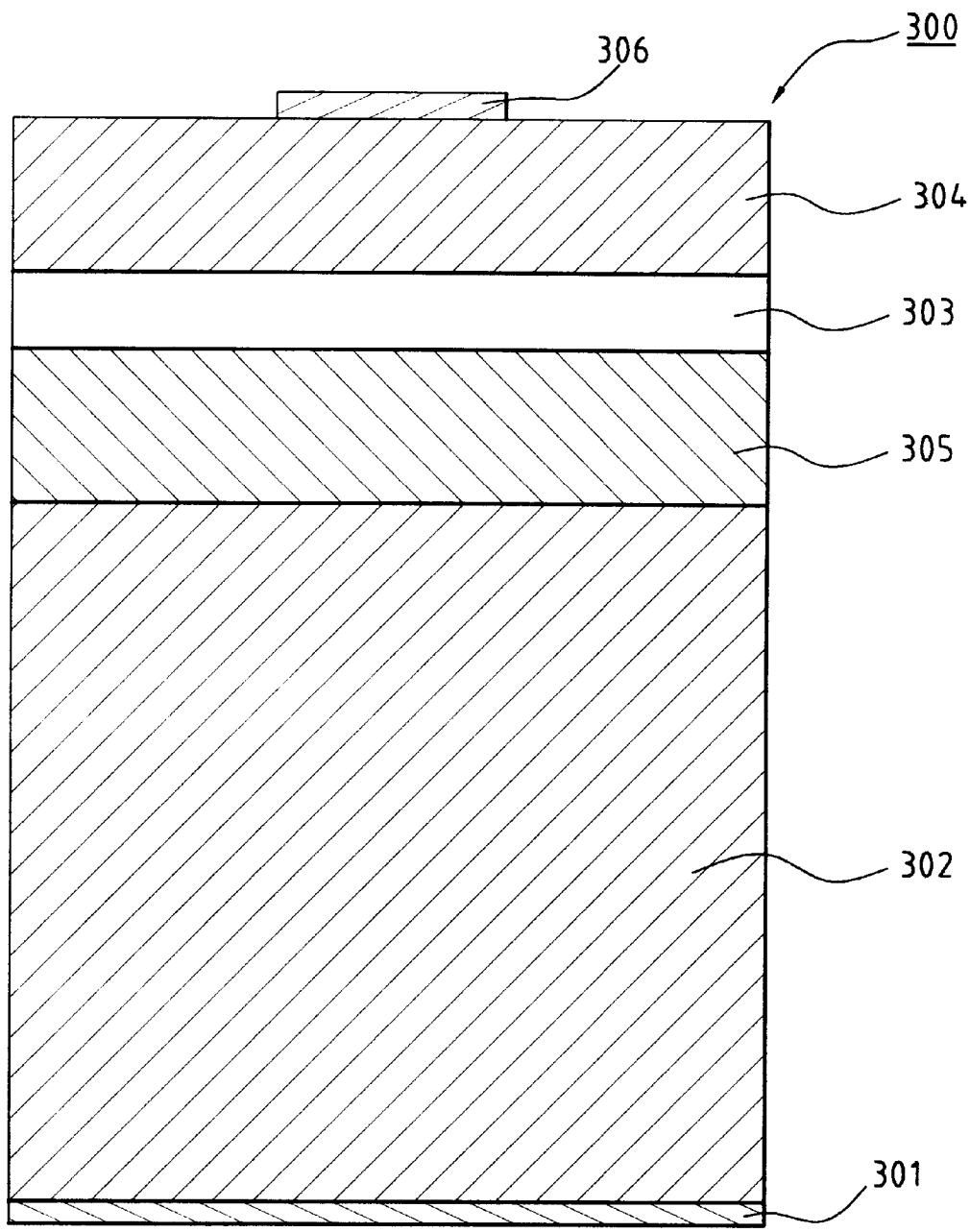
FIG. 3 is a cross-sectional view of the conventional DBR LED.

U.S. Pat. Nos. 5,237,581 and 4,570,172 disclose DBR LEDs 300 having upper and lower multilayer reflectors which are shown in FIG. 3. The DBR LED 300 contains a semiconductor substrate 302, a lower multilayer reflector 305 formed on the substrate 302, a light generating region 303 formed on the lower multilayer reflector 305, an upper multilayer reflector 304 formed on the light generating region 303, a first ohmic contact 306 formed on the upper multilayer reflector 304, and a second ohmic contact 301 formed on the substrate 302. In the DBR LEDs, 90% of the light emitted from the light generating region 303 toward the light absorption substrate 302 is reflected back upwardly by means of the lower multilayer reflector 305. The upper multilayer reflector 304 can guide the emitted light toward the upper surface of the DBR LED in order to solve the problem that most of the emitted light is absorbed by the light absorbing substrate 302, and in order to solve the problem that the brightness of the DBR LED is not high because of the limited incident light critical angle. However, many hetero junctions are formed in the upper and lower multilayer reflectors 305 and 304, the bandgap discontinuity effect ($\Delta E_c$ and $\Delta E_v$) greatly affects the performance of the DBR LED. Then, the forward bias voltage $V_f$ and thus the power consumption of the DBR LED are increased.

In the present invention, all the semiconductor layers, such as, light generating region 403, buffer layer 407, etc., are formed by metal-organic chemical vapor deposition (MOCVD). The temperature of MOCVD is from 500 to 750° C. and pressure is from 100 to 300 mbar.

Figure 4:
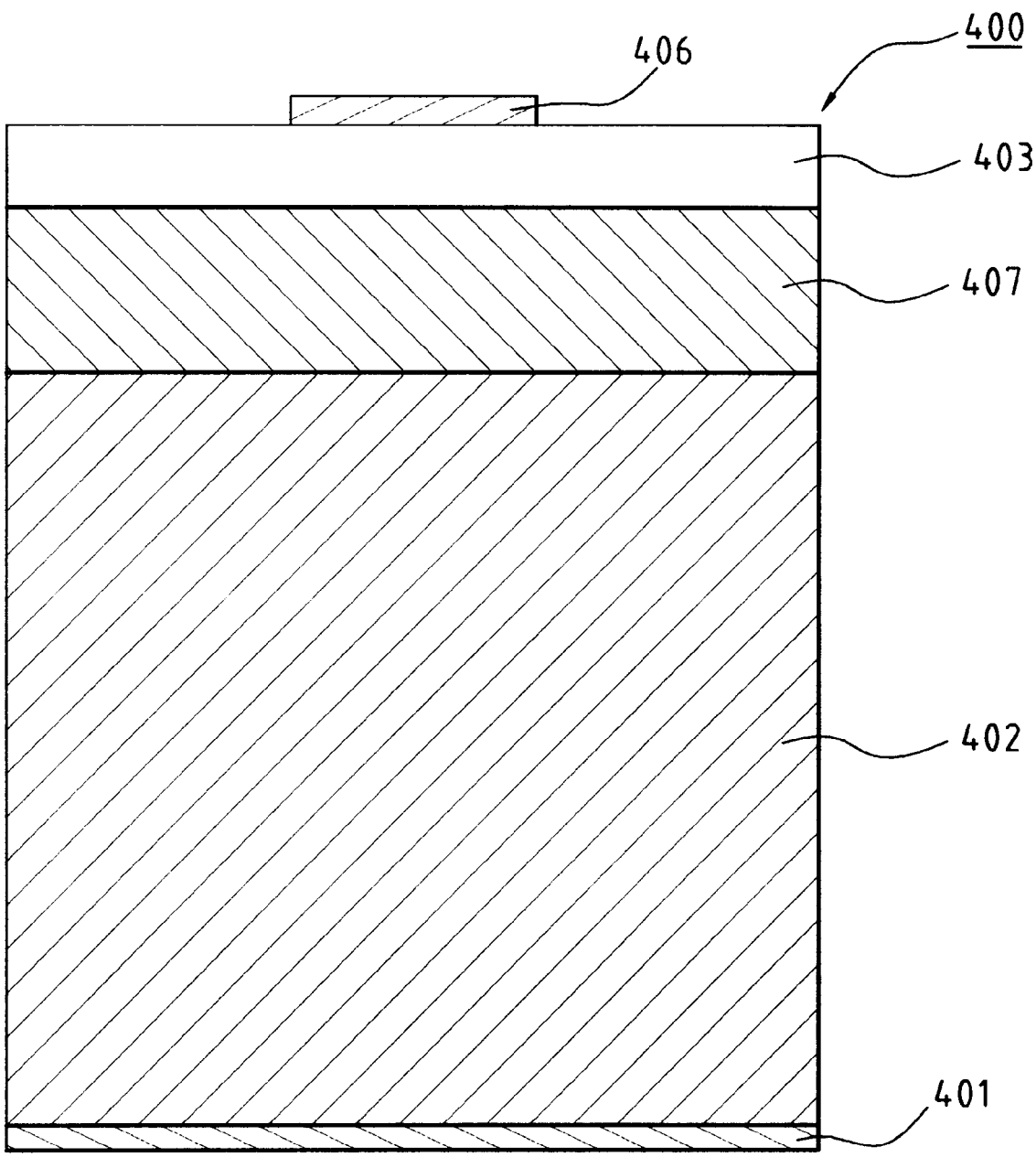
FIG. 4 is a cross-sectional view of the LED of the present invention.

As shown in FIG. 4, in the present invention, a transparent n-type GaP substrate 402 is used. An AlGaInP buffer layer 407 having graded lattice constant is formed on the GaP substrate 402. Then, an AlGaInP light generating region 403 is formed on the AlGaInP buffer 407. First and second ohmic contacts 401 and 406 are formed on the GaP substrate 402 and the AlGaInP light generating region 403 respectively. The composition of AlGaInP light generating region 403 is n-$(Al_{0.7}Ga_{0.3})_{0.5}In_{0.5}P$/n-$(Al_{0.3}Ga_{0.7})_{0.5}$ $In_{0.5}P$/p-$(Al_{0.7}Ga_{0.3})_{0.5}In_{0.5}P$. The composition of the buffer layer 407 having a graded lattice constant is $(Al_xGa_{1-x})_yIn_{1-y}P$, $0 \leq x \leq 0.7$, $0.5 \leq y \leq 1$. The lattice constant of the buffer layer is to change from the first lattice constant at the junction between the transparent GaP substrate 402 and the buffer layer 407 to the second lattice constant at the junction between the buffer layer 407 and the AlGaInP light generating region 403 in order to avoid the dislocation and defect due to lattice mismatch which results in a poor epitaxy quality.

In the present invention, the thickness of the GaP substrate 402 is between 200 μm and 350 μm, preferably 270 μm. The thickness of the buffer layer 407 having a graded lattice constant is between 3 μm and 25 μm, preferably 5 μm. The thickness of the AlGaInP light generating region 403 is between 2 μm and 25 μm, preferably 3.5 μm. The material of the first ohmic contact 401 to the GaP substrate 402 is AuGe. The material of the second ohmic contact 406 formed on the AlGaInP light generating region 403 is AuZn. Other materials may be used to form the ohmic contact.

Figure 5:
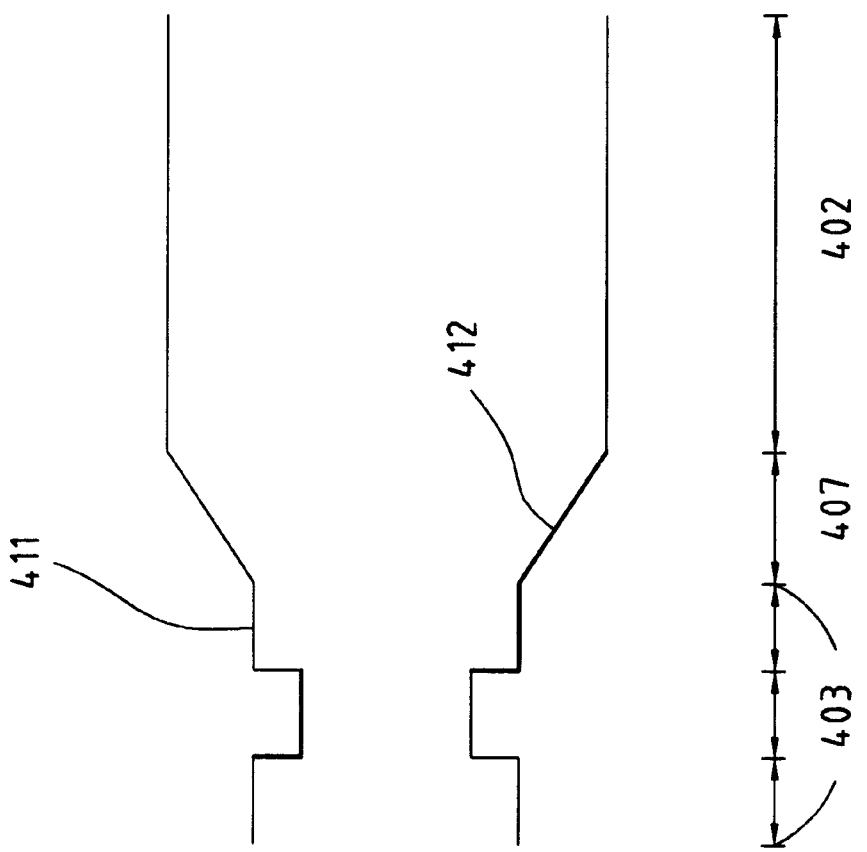
FIG. 5 is an energy band diagram of the LED of FIG. 4.

FIG. 5 is an energy band diagram of FIG. 4 of the present invention. In FIG. 5, the relationship of the conduction band 411 and valence band 412 between all the layers 402, 403, and 407 is shown.

In the present invention, the MOCVD technique is used. However, the layers 402, 403, and 407 may be formed by other techniques, such as, MBE, VPE, and LPE.

While the invention has been particularly shown and described with reference to these preferred embodiments, it will be understood by those skilled in the art that various changes in form and details may be made without departing from the spirit and scope of the invention. Although only the preferred embodiments of this invention were shown and described in the above description, it is requested that any modification or combination that comes within the spirit of this invention be protected.

What is claimed is:

1. A light emitting diode having a transparent substrate, comprising:

a transparent GaP semiconductor substrate of a first conductivity type having a first lattice constant;

a first ohmic contact connected to said transparent substrate;

a buffer layer of said first conductivity type formed on said transparent substrate, said buffer layer having a first lattice constant at a first junction formed between said buffer layer and said transparent substrate;

a light generation region formed on said buffer layer, said buffer layer having a second lattice constant at a second junction formed between said buffer layer and said light generation region; and a second ohmic contact formed on said light generation region;

wherein said buffer layer comprises $(Al_xGa_{1-x})_yIn_{1-y}P$ with $0 \leq x \leq 1$ and $0 \leq y \leq 1$ for having a graded lattice constant gradually changing from said first lattice constant to said second lattice constant.

2. The light emitting diode as claimed in claim 1, said buffer layer having a thickness in the range between 3 μm to 25 μm.

3. The light emitting diode as claimed in claim 1, said light generation region comprising multi-layers of $(Al_wGa_{1-w})_sIn_{1-s}P$ with $0 \leq w \leq 0.6$ and $0.4 \leq s \leq 0.6$ of first and second conductivity types.

* * * * *